(12) United States Patent
Lee et al.

(10) Patent No.: US 9,331,109 B2
(45) Date of Patent: May 3, 2016

(54) DEVICE FOR MONITORING LIQUID CRYSTAL DISPLAY AND METHOD FOR MANUFACTURING LIQUID CRYSTAL DISPLAY

(71) Applicant: Samsung Display Co., Ltd., Yongin (KR)

(72) Inventors: Seon Uk Lee, Seongnam-si (KR); Won Tae Kim, Suwon-si (KR); Min Ho Moon, Anyang-si (KR); Hong Sick Park, Suwon-si (KR); Sung Hwan Won, Suwon-si (KR); You Young Jin, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/962,366

(22) Filed: Aug. 8, 2013

(65) Prior Publication Data

US 2014/0322845 A1  Oct. 30, 2014

(30) Foreign Application Priority Data

Apr. 24, 2013 (KR) .......................... 10-2013-0045739

(51) Int. Cl.
*G02F 1/1333* (2006.01)
*G02F 1/13* (2006.01)
*H01L 27/12* (2006.01)
*H01L 51/50* (2006.01)

(52) U.S. Cl.
CPC .................................. *H01L 27/1259* (2013.01)

(58) Field of Classification Search
CPC ............ H01L 27/124; H01L 27/1259; H01L 27/1214; H01L 27/1248; H01L 27/1262; H01L 27/156; H01L 27/3232; H01L 29/41733; H01L 29/78603; H01L 33/005
USPC ........................................................... 438/30
See application file for complete search history.

(56) References Cited

U.S. PATENT DOCUMENTS

| 5,461,003 A * | 10/1995 | Havemann et al. ........... 438/666 |
| 6,469,761 B1 * | 10/2002 | Drabik et al. ................. 349/122 |
| 2006/0099818 A1 * | 5/2006 | Fan et al. ...................... 438/749 |
| 2009/0140647 A1 * | 6/2009 | Chung et al. .................. 313/504 |
| 2012/0062448 A1 * | 3/2012 | Kim et al. ....................... 345/55 |

FOREIGN PATENT DOCUMENTS

KR  10-2012-0026880  3/2012

* cited by examiner

*Primary Examiner* — Julia Slutsker
*Assistant Examiner* — Natalia Gondarenko
(74) *Attorney, Agent, or Firm* — H.C. Park & Associates, PLC

(57) ABSTRACT

A device for monitoring a liquid crystal display includes: a substrate including a display region and a non-display region disposed at an edge of the display region. The display region includes: a thin film transistor disposed on the substrate, a pixel electrode disposed on the substrate and connected to the thin film transistor, a first sacrificial layer disposed on the pixel electrode, and a roof layer disposed on the sacrificial layer. The non-display region includes: a second sacrificial layer disposed on the substrate, and the roof layer disposed on the second sacrificial layer. The first sacrificial layer has a first longitudinal dimension and a first cross-sectional area, and the second sacrificial layer has a second longitudinal dimension and a second cross-sectional area. The first cross-sectional area is the same as the second cross-sectional area. The second longitudinal dimension is greater than the first longitudinal dimension.

10 Claims, 8 Drawing Sheets

DEVICE FOR MONITORING LIQUID CRYSTAL DISPLAY AND METHOD FOR MANUFACTURING LIQUID CRYSTAL DISPLAY

CROSS-REFERENCE TO RELATED APPLICATION

This application claims priority from and the benefit of Korean Patent Application No. 10-2013-0045739, filed on Apr. 24, 2013, which is incorporated by reference for all purposes as if set forth herein.

BACKGROUND

1. Field

Exemplary embodiments relate to display technology, and, more particular, to a device for monitoring a liquid crystal display and a method for manufacturing the liquid crystal display.

2. Discussion

Conventional liquid crystal displays typically include two display panels having field generating electrodes, such as a pixel electrode and a common electrode, and a liquid crystal layer disposed therebetween. In this manner, traditional liquid crystal displays are configured to display an image by applying a voltage to one or more of the field generating electrodes, which, in turn, imposes an electric field on the liquid crystal layer. The imposition of the electric field is configured to affect the alignment of liquid crystal molecules of the liquid crystal layer, and, thereby, control the polarization of incident light.

One type of conventional liquid crystal display is a nanocrystal liquid crystal display (NCD), in which a display panel is manufactured by forming a sacrificial layer using, for example, an organic material, or the like, forming a support member on an upper portion of the sacrificial layer, removing the sacrificial layer, and filling liquid crystal in a microcavity formed by the removal of the sacrificial layer. Since the sacrificial layer is surrounded by a support structure (e.g., a supporting layer), an etching (or stripping) material (or solution) is typically utilized to remove the sacrificial layer. In this manner, the etching material is usually injected into an injection hole to reach the sacrificial layer. The processing time to etch an exposed target through an injection hole, however, can be relatively long, and, thereby, may increase the cost to manufacture the display device. Also, if the etching material is repeatedly used, an etching speed may be reduced, which may result in portions of the sacrificial layer not being fully removed.

The above information disclosed in this Background section is only for enhancement of understanding of the background of the invention, and, therefore, it may contain information that does not form the prior art that is already known in this country to a person of ordinary skill in the art.

SUMMARY

Exemplary embodiments provide a device for monitoring a liquid crystal display and a method for manufacturing the liquid crystal display to reduce the processing time and prevent (or otherwise reduce) the occurrence of portions of the sacrificial layer not being fully removed.

Additional aspects will be set forth in the detailed description which follows and, in part, will be apparent from the disclosure, or may be learned by practice of the invention.

According to exemplary embodiments, a device for monitoring a liquid crystal display, includes: a substrate including a display region and a non-display region disposed at an edge of the display region. The display region includes: a thin film transistor disposed on the substrate, a pixel electrode disposed on the substrate and connected to the thin film transistor, a first sacrificial layer disposed on the pixel electrode, and a roof layer disposed on the first sacrificial layer. The peripheral region includes: a second sacrificial layer disposed on the substrate, and the roof layer disposed on the second sacrificial layer. The first sacrificial layer has a first longitudinal dimension and a first cross-sectional area, and the second sacrificial layer has a second longitudinal dimension and a second cross-sectional area. The first cross-sectional area is the same as the second cross-sectional area. The second longitudinal dimension is longer than the first longitudinal dimension.

According to exemplary embodiments, a method for manufacturing a liquid crystal display, includes: applying a sacrificial layer forming material on a substrate including a display region and a non-display region, patterning the sacrificial layer forming material using a mask to form a first sacrificial layer in the display region and a second sacrificial layer in the non-display region, forming a roof layer to cover the first sacrificial layer and the second sacrificial layer, and simultaneously etching the first sacrificial layer and the second sacrificial layer. The first sacrificial layer has a first longitudinal dimension and a first cross-sectional area, and the second sacrificial layer has a second longitudinal dimension and a second cross-sectional area. The first cross-sectional area is the same as the second cross-sectional area. The second longitudinal dimension is longer than the first longitudinal dimension.

According to exemplary embodiments, the use of, for example, one or more etching materials is monitored in various regions during the formation of a display device and is replaced to prevent (or otherwise reduce) the occurrence of a portion of the sacrificial layer from not being fully removed, as well as to reduce the processing time and cost of the associated display device.

The foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Figure 1:
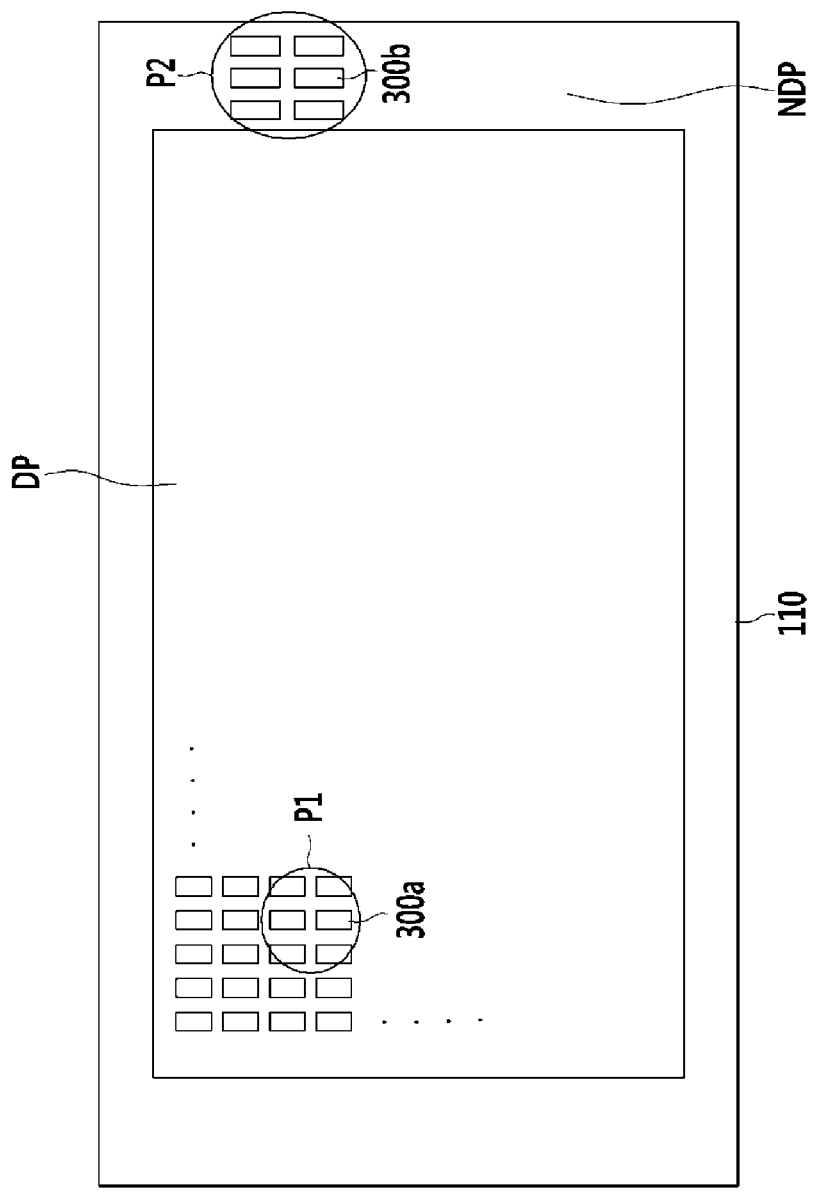
FIG. 1 is a layout view of a device for monitoring a liquid crystal display, according to exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc., may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of the present disclosure.

Spatially relative terms, such as "beneath," "below," "lower," "above," "upper," and/or the like, may be used herein for descriptive purposes, and, thereby, to describe one element or feature's relationship to another element(s) or feature(s) as illustrated in the drawings. Spatially relative terms are intended to encompass different orientations of an apparatus in use or operation in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and as such, the spatially relative descriptors used herein interpreted accordingly.

The terminology used herein is for the purpose of describing particular embodiments and is not intended to be limiting. As used herein, the singular forms "a," "an," and "the" are intended to include the plural forms as well, unless the context clearly indicates otherwise. Moreover, the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

While exemplary embodiments are described in association with liquid crystal display (LCD) devices, it is contemplated that exemplary embodiments may be utilized in association with other or equivalent display devices, such as various self-emissive and/or non-self-emissive display technologies. For instance, self-emissive display devices may include organic light emitting displays (OLED), plasma display panels (PDP), etc., whereas non-self-emissive display devices may include electroluminescent (EL) displays, electrophoretic displays (EPD), electrowetting displays (EWD), etc.

Figure 2:
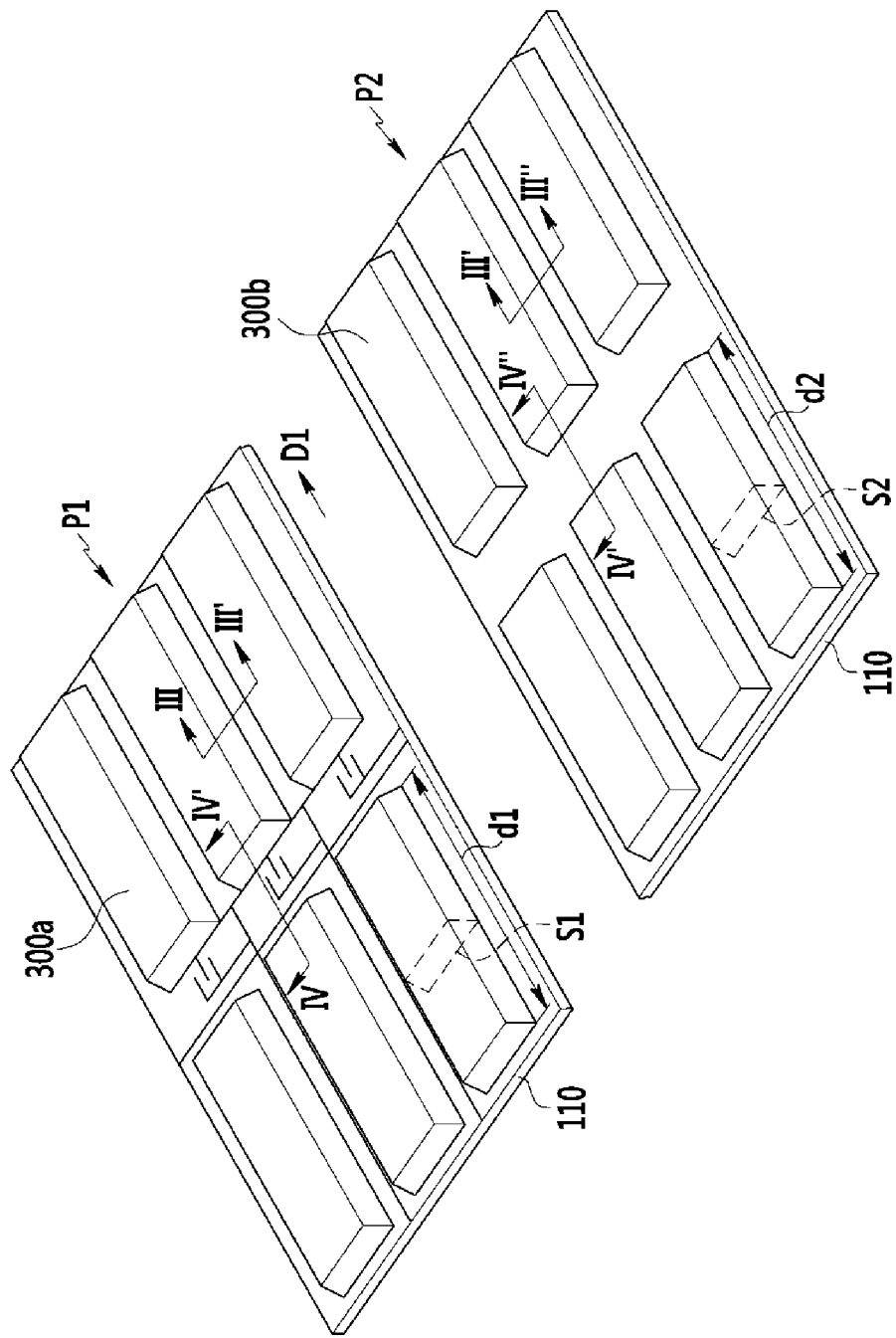
FIG. 2 is a perspective view of a portion of a display region and a peripheral region of the display device of FIG. 1, according to exemplary embodiments.
Figure 3:
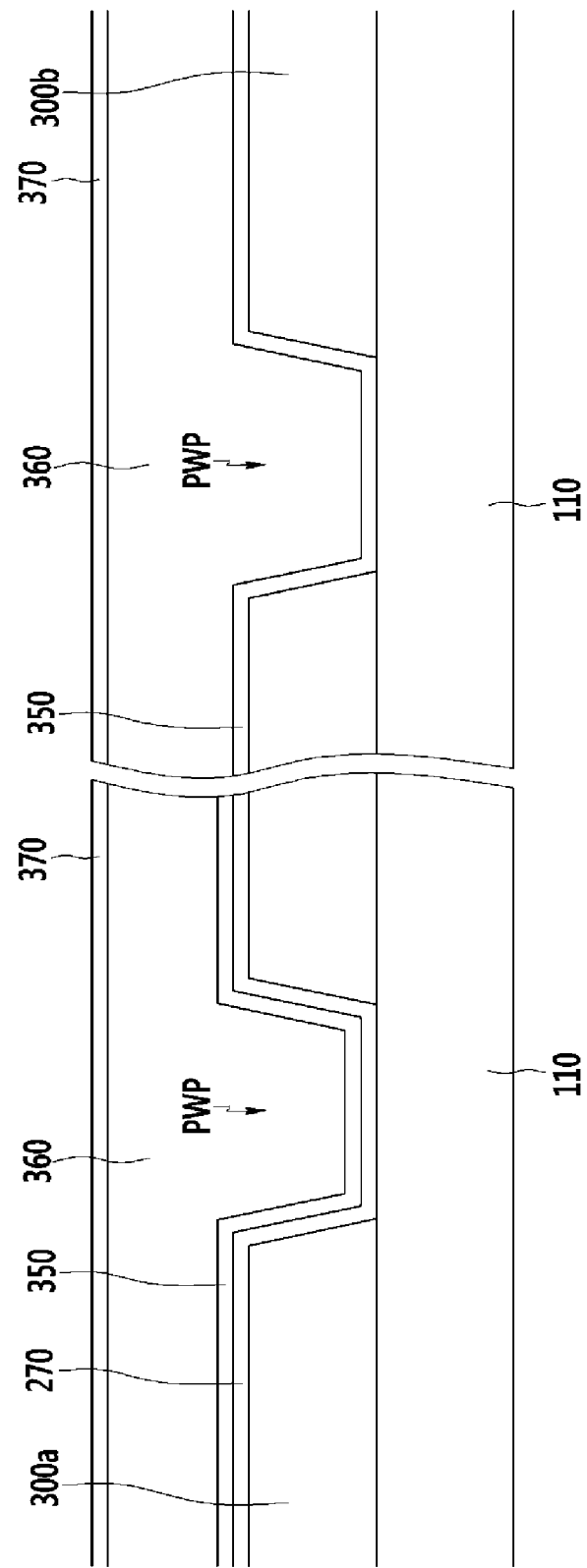
FIG. 3 is a cross-sectional view of the respective portions of FIG. 2 taken along sectional lines III-III' and III'-III", according to exemplary embodiments.
Figure 4:
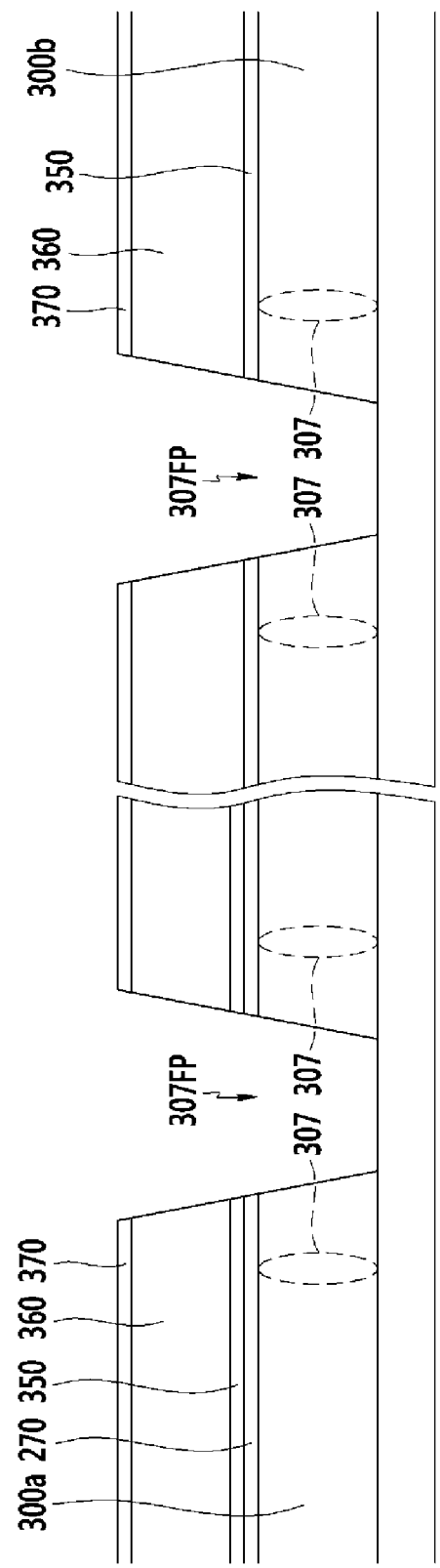
FIG. 4 is a cross-sectional view of the respective portions of FIG. 2 taken along sectional lines IV-IV' and IV'-IV", according to exemplary embodiments.

FIG. 1 is a layout view of a device for monitoring a liquid crystal display, according to exemplary embodiments. FIG. 2 is a perspective view of a portion of a display region and a peripheral region of the display device of FIG. 1. FIG. 3 is a cross-sectional view of the respective portions of FIG. 2 taken along sectional lines III-III' and III'-III", according to exemplary embodiments. FIG. 4 is a cross-sectional view of the respective portions of FIG. 2 taken along sectional lines IV-IV' and IV'-IV", according to exemplary embodiments.

Referring to FIG. 1, a device for monitoring a liquid crystal display includes a substrate 110, which includes a display region DP and a non-display region (such as a peripheral region) NDP. The display region DP is a region in which one or more signal lines, one or more thin film transistors, and one or more field generating electrodes are formed to facilitate the display of an image for presentation to an observer. The non-display region NDP may be a region positioned at one or more edge portions of the display region DP, and, for example, surrounds the display region DP. In this manner, the non-display region NDP may bound the display region DP. As such, the non-display region NDP may be interchangeably referred to herein as "the non-display region" or the "peripheral region" NDA. To this end, the non-display region NDP may be a region in which an image is not presented. In exemplary embodiments, one or more driving units (not shown) and/or other components may be positioned.

According to exemplary embodiments, a first sacrificial layer 300a is disposed at a position corresponding to a pixel region in the display region DP, and a second sacrificial layer 300b is disposed in the peripheral region NDP. In exemplary embodiments, the second sacrificial layer 300b may have the same shape and/or configuration as the first sacrificial layer 300a. It is contemplated, however, that the shape, configuration, etc., of the first and second sacrificial layers 300a and 300b may be different. As will become more apparent below, when the configurations of the first and second sacrificial layers 300a and 300b are different, the respective configurations may be provided to enable a rate of etching to be the same for the first and second sacrificial layers 300a and 300b. To this end, the first sacrificial layer 300a and the second sacrificial layer 300b may be formed of any suitable material, such as, for example, an organic material, e.g., photoresist.

Referring to FIG. 2, a region P1, which is an illustrative portion of the display region DP, includes the first sacrificial layer 300a, which is one of a plurality of first sacrificial layers 300a in a pattern of first sacrificial layers 300a disposed adjacent to each other. Each of the first sacrificial layers 300a longitudinally extends in a sacrificial layer etching direction D1, which is described in more detail later.

Region P2 is a portion of the peripheral region NDP and includes the second sacrificial layer 300b, which is one of a plurality of second sacrificial layers 300b in a pattern of second sacrificial layers 300b disposed adjacent to each other. Although the drawings illustrate a plurality of second sacrificial layers 300b, it is contemplated that only one second sacrificial layer 300b may be provided. Each of the second sacrificial layers 300b longitudinally extends in the sacrificial layer etching direction D1. It is contemplated, however, that the second sacrificial layers 300b may extend in a different direction than the first sacrificial layers 300a. In exemplary embodiments, a separation distance (or pitch) between first sacrificial layers 300a in the pattern of first sacrificial layers 300a and a separation distance between second sacrificial layers 300b in the pattern of second sacrificial layers 300b may be the same as each other. It is contemplated, however, that they may be different.

According to exemplary embodiments, a first sacrificial layer 300a has a first length d1 and a first cross-sectional area S1 in the sacrificial layer etching direction D1. The second sacrificial layer 300b has a second length d2 and a second cross-sectional area S2 in the sacrificial layer etching direction D1. The first cross-sectional area S1 of the first sacrificial layer 300a and the second cross-sectional area S2 of the second sacrificial layer 300b may be the same as each other, but the second length d2 of the second sacrificial layer 300b may be longer than the first length d1 of the first sacrificial layer 300a. It is contemplated; however, that other relationships may be utilized. For instance, the first and second cross-sectional areas S1 and S2 may be different, the first and second lengths d1 and d2 may be the same, the first length d1 may be longer than the second length d2, etc.

In exemplary embodiments, the same mask may be used in order to form the first sacrificial layers 300a and the second sacrificial layers 300b having the aforementioned shape, where S1=S2 and d2>d1.

Referring to FIGS. 3 and 4, a common electrode 270 is positioned on the first sacrificial layer 300a. The common electrode 270 may or may not be positioned on the second sacrificial layer 300b formed in the peripheral region NDP.

A first (e.g., lower) insulating layer 350 is positioned on the common electrode 270 and the second sacrificial layer 300b. The lower insulating layer 350 may be formed of any suitable insulating material, such as, for example, silicon nitride (SiNx), silicon oxide (SiOx). A roof layer 360 is positioned on the lower insulating layer 350. The roof layer 360 may include any suitable material, such as, for instance, silicon oxycarbide (SiOC), photoresist, and/or any other suitable organic material(s).

A second (e.g., upper) insulating layer 370 is positioned on the roof layer 360. The upper insulating layer 370 may be formed of any suitable insulating material, such as, for instance, silicon nitride (SiNx), silicon oxide (SiOx), etc.

According to exemplary embodiments, the roof layer 360 and/or one or more other layers (e.g., portions of the common electrode 270 and/or the lower insulating layer 350) fill a space between the first sacrificial layers 300a and a space between the second sacrificial layers 300b, these spaces being disposed between first sacrificial layers 300a or second sacrificial layers 300b that are adjacent to one another in a second (e.g., horizontal) direction. The second direction may relate to a direction of longitudinal extension of one or more gate lines, which are described in more detail in association with FIG. 7. To this end, the second direction may be perpendicular (or substantially perpendicular) to the etching direction D1. In this manner, the roof layer 360 forms a partition forming portion PWP. The partition forming portion PWP serves to support microcavities from when the first sacrificial layer 300a and the second sacrificial layer 300b are removed.

Figure 7:
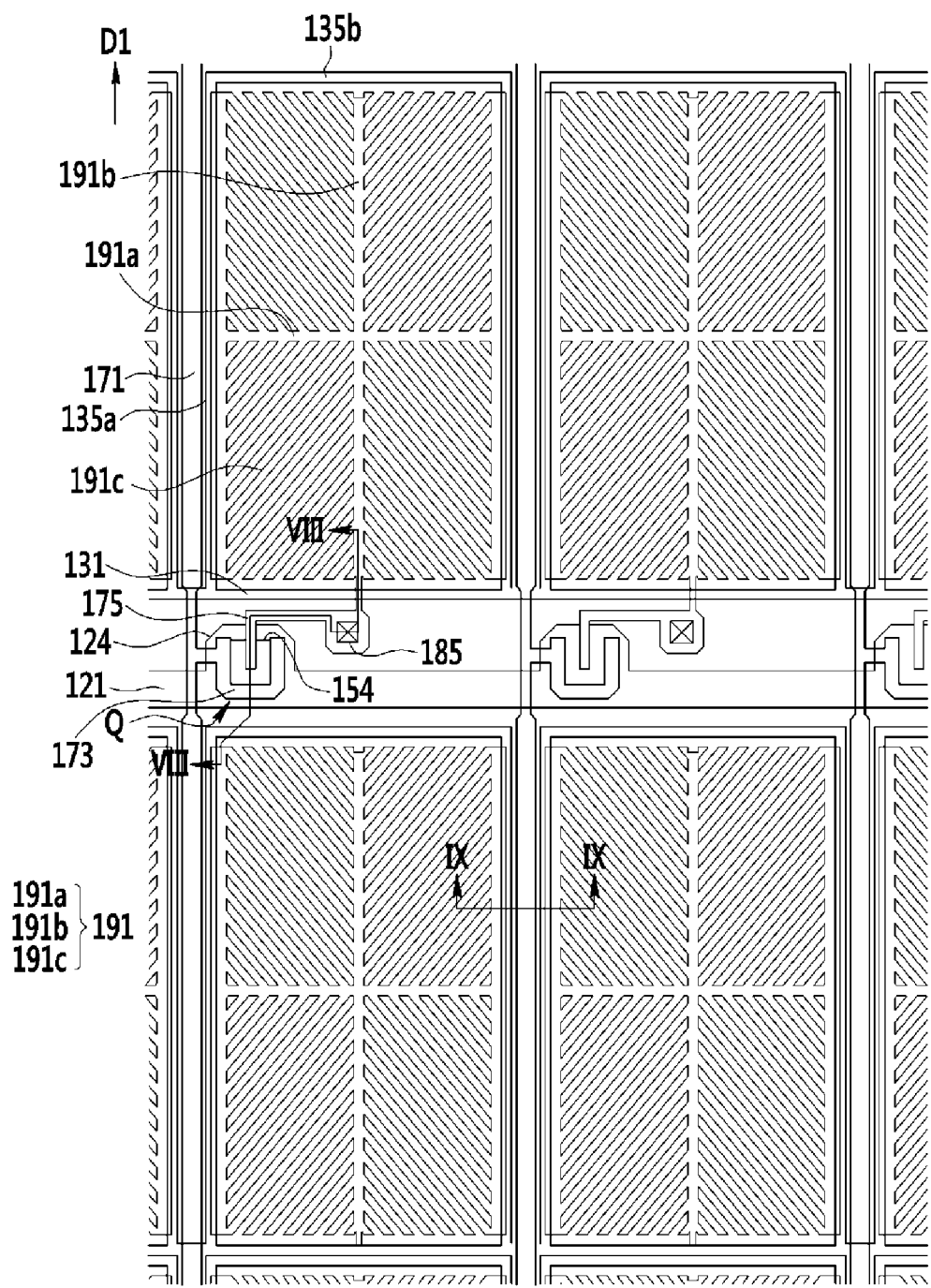
FIG. 7 is a plan view of a liquid crystal display, according to exemplary embodiments.

A liquid crystal injection hole forming region 307FP is positioned between the first sacrificial layers 300a and between the second sacrificial layers 300b, which are adjacent to one another in a first (e.g., vertical) direction, which may correspond to the longitudinal extension direction of a data line, which is descried in more detail in association with FIG. 7. In this manner, the exposed portions of the first sacrificial layer 300a and the second sacrificial layer 300b may begin to be etched from an inlet portion 307.

As illustrated in FIGS. 3 and 4, the space between the first sacrificial layers 300a and the space between the second sacrificial layers 300b, which are adjacent to one another in a horizontal direction, are surrounded by the partition forming portion PWP, such as the roof layer 360. The space between the first sacrificial layers 300a and the space between the second sacrificial layers 300b, which are adjacent to one another in a vertical direction, are etched in a vertical direction since the first sacrificial layers 300a and the second sacrificial layers 300b are exposed via the liquid crystal injection hole forming region 307FP. In other words, the sacrificial layer etching direction D1 may be the aforementioned vertical direction.

According to exemplary embodiments, if the duration over which the first sacrificial layer 300a is completely removed by an initial sacrificial layer removal etchant (e.g., a liquid chemical) is considered a first processing time, then the first sacrificial layer 300a and the second sacrificial layer 300b may be etched (or otherwise removed) over a second processing time (or duration) that is about 120% to 150%, e.g., about 130% to 140%, of the first process time. In this manner, the second processing time may be longer than the first processing time, and may be a length of time about 150% of the first processing time. To this end, etching the first sacrificial layers 300a and the second sacrificial layers 300b over the second processing time prevents (or otherwise reduces) the potential of the first sacrificial layers 300a from not being completely etched or otherwise removed. It is contemplated, however, that the second processing time may be greater than the first processing time by any suitable amount, and, therefore, exemplary embodiments are not to be limited by the aforementioned 120% to 150% numerical range.

A device for monitoring the liquid crystal display, according to exemplary embodiments, may confirm complete removal of the first sacrificial layer 300a and an amount (or degree) of over-etching of the second sacrificial layer 300b during the second processing time. This is described in more detail in association with FIGS. 5 and 6.

Figure 5:
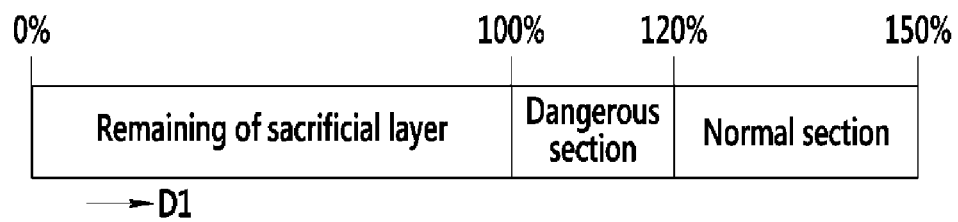
FIG. 5 schematically illustrates an over-etching degree used by a device for monitoring a liquid crystal display, according to exemplary embodiments.

FIG. 5 schematically illustrates an over-etching degree used by a device for monitoring a liquid crystal display, according to exemplary embodiments.

As seen in FIG. 5, the amount or degree of over-etching of the second sacrificial layer 300b in the sacrificial layer etching direction D1 is a percentage, and a section where the amount of over-etching of the second sacrificial layer 300b ranges from 100% of the first length d1 of the first sacrificial layer 300a to 120% of the first length d1 may be defined as a "warning" section, and a section where the degree of over-etching ranges from 120% of the first length d1 to 150% of the first length d1 may be defined as a "normal" section.

In exemplary embodiments, etching lengths of the first sacrificial layer 300a and the second sacrificial layer 300b are in proportion to the etching processing times, and, thereby, the relative configurations of the first and second sacrificial layers 300a and 300b. For instance, when the degree of etching of the second sacrificial layer 300b does not reach 100% of the first length (d1), then the first sacrificial layer 300a is not completely removed, and, as such, at least a portion thereof remains. This section may be defined as a "remaining portion" section. When 120% of the first length d1 is a first upper limit value (%) and 150% of the first length d1 is a second upper limit value (%), the first upper limit value (%) and the second upper limit value (%) may be adjusted based on the individual and relative configurations of the first and second sacrificial layers 300a and 300b.

According to exemplary embodiments, when the device provides an indication that the degree of over-etching of the second sacrificial layer 300b is in the warning section or the remaining portion section, then it may be determined that it is time to replace the initial sacrificial layer removal etchant (e.g., liquid chemical) with new (or fresh) sacrificial layer removal etchant.

Figure 6:
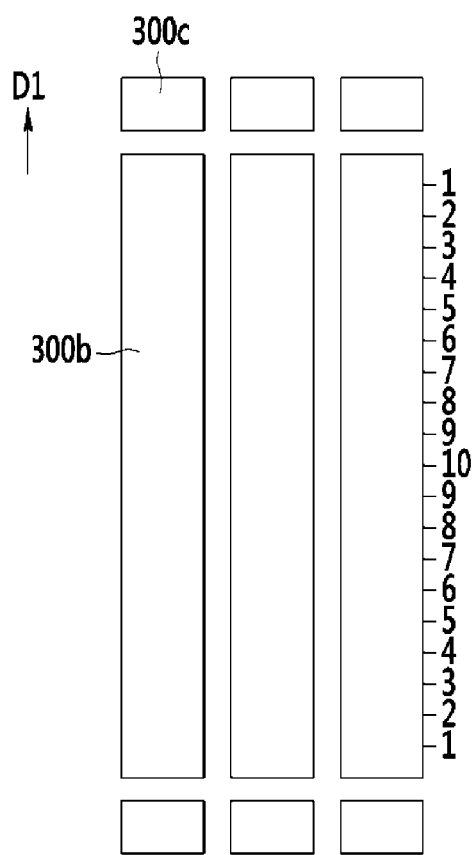
FIG. 6 is a plan view of the device for monitoring a liquid crystal display, according to exemplary embodiments.

FIG. 6 is a plan view of the device for monitoring the liquid crystal display, according to exemplary embodiments.

Referring to FIG. 6, a dummy sacrificial layer 300c is formed adjacent to the second sacrificial layer 300b. The dummy sacrificial layer 300c has the same cross-section as the second sacrificial layer 300b, but may have a smaller length than the second sacrificial layer 300b in the sacrificial layer etching direction D1. The dummy sacrificial layer 300c serves to construct an etching environment that is similar to that of the first sacrificial layers 300a included in the display region DP. For example, the first sacrificial layer 300a included in the display region DP may be one of a plurality of first sacrificial layers 300a in a pattern of first sacrificial layers 300a. To this end, the second sacrificial layer 300b may be formed of one sacrificial layer 300b. In this manner, the dummy sacrificial layer 300c may serve to correspond to another second sacrificial layer 300b adjacent to the one second sacrificial layer 300b, so that the etching conditions for the one second sacrificial layer 300b is similar to the etching conditions of the first sacrificial layer 300a in the pattern of first sacrificial layers 300a.

According to exemplary embodiments, the second sacrificial layer 300b includes gradations marked along its longitudinal dimension to facilitate confirmation of the degree of over-etching of the second sacrificial layer 300b. For instance, the second sacrificial layer 300b may at least include gradations associated with each of the aforementioned warning, normal, and remaining portion sections. It is contemplated, however, that one or more intermediary gradations may be provided between the aforementioned warning, normal, and remaining portion sections. In this manner, the gradations may be provided at any suitable level of granularity.

A method for manufacturing the liquid crystal display using the aforementioned device for monitoring the liquid crystal display will be described in association with FIGS. 1-4.

Referring to FIGS. 1-4, in the method for manufacturing the liquid crystal display, a sacrificial layer forming material is applied on a substrate 110 including a display region DP and a peripheral region NDP.

The sacrificial layer forming material is patterned using a mask to form first sacrificial layers 300a in the display region DP and form one or more second sacrificial layers 300b in the peripheral region NDP. The first sacrificial layers 300a and the one or more second sacrificial layers 300b may be formed so that each of the first sacrificial layers 300a have a first length d1 and a first cross-sectional area S1 and the one or more second sacrificial layer 300b have a second length d2 and a second cross-sectional area S2. The first cross-sectional area S1 and the second cross-sectional area S2 may be the same as each other, and the second length d2 may be longer than the first length d1.

A roof layer 360 is formed to cover the first sacrificial layers 300a and the one or more second sacrificial layers 300b. Before the roof layer 360 is formed, a common electrode 270 and a lower insulating layer 350 may be formed, and the common electrode 270 may be formed on just the first sacrificial layers 300a or on both the first sacrificial layers 300a and one or more of the second sacrificial layers 300b. An upper insulating layer 370 is formed on the roof layer 360.

The first sacrificial layers 300a and the one or more second sacrificial layer 300b may be simultaneously etched over a determined second processing time. If a duration of time for which it takes the first sacrificial layers 300a to be completely removed by an initial sacrificial layer removal etchant (e.g., liquid chemical) is a first processing time, the second processing time may be longer than the first processing time, and may be about 150% of the first processing time.

When the first sacrificial layer 300a is completely removed during the second processing time, a degree of over-etching of the second sacrificial layer 300b may be monitored and confirmed. In this manner, as described above, a section where the degree of over-etching of the second sacrificial layer 300b ranges from 100% of the first length d1 to a determined first upper limit value (%) of the first length d1 may be defined as a warning section, and a section where the degree of over-etching ranges from the determined first upper limit value (%) to a determined second upper limit value (%) may be defined as a normal section. To this end, the determined first upper limit value (%) may be larger than 100%, and the determined second upper limit value (%) may be set to be larger than the first upper limit value (%). Further, when the degree of etching of the second sacrificial layer 300b does not reach 100% of the first length d1, it is known that the first sacrificial layer 300a is not completely removed, and, thereby, a portion thereof remains. This section may be defined as a remaining portion section.

When the degree of over-etching of the second sacrificial layer 300b is included in the warning section or the remaining portion section, the sacrificial layer removal etchant (e.g., liquid chemical) may be replaced. In this manner, after the first sacrificial layer 300a is completely removed, those structures including the second sacrificial layer 300b positioned in the peripheral region NDP may be removed.

Figure 8:
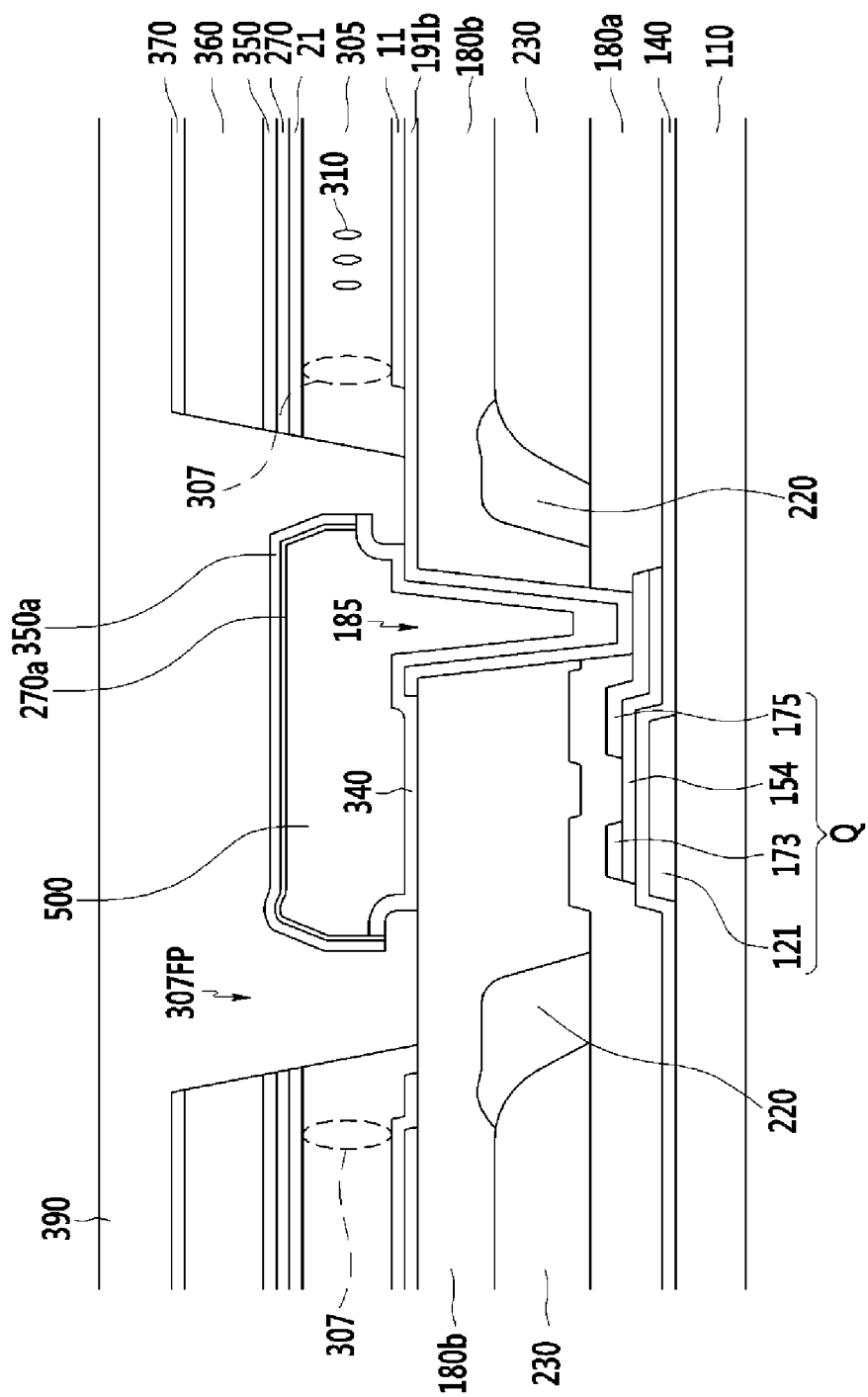
FIG. 8 is a cross-sectional view of the liquid crystal display of FIG. 7 taken along sectional line VIII-VIII, according to exemplary embodiments.
Figure 9:
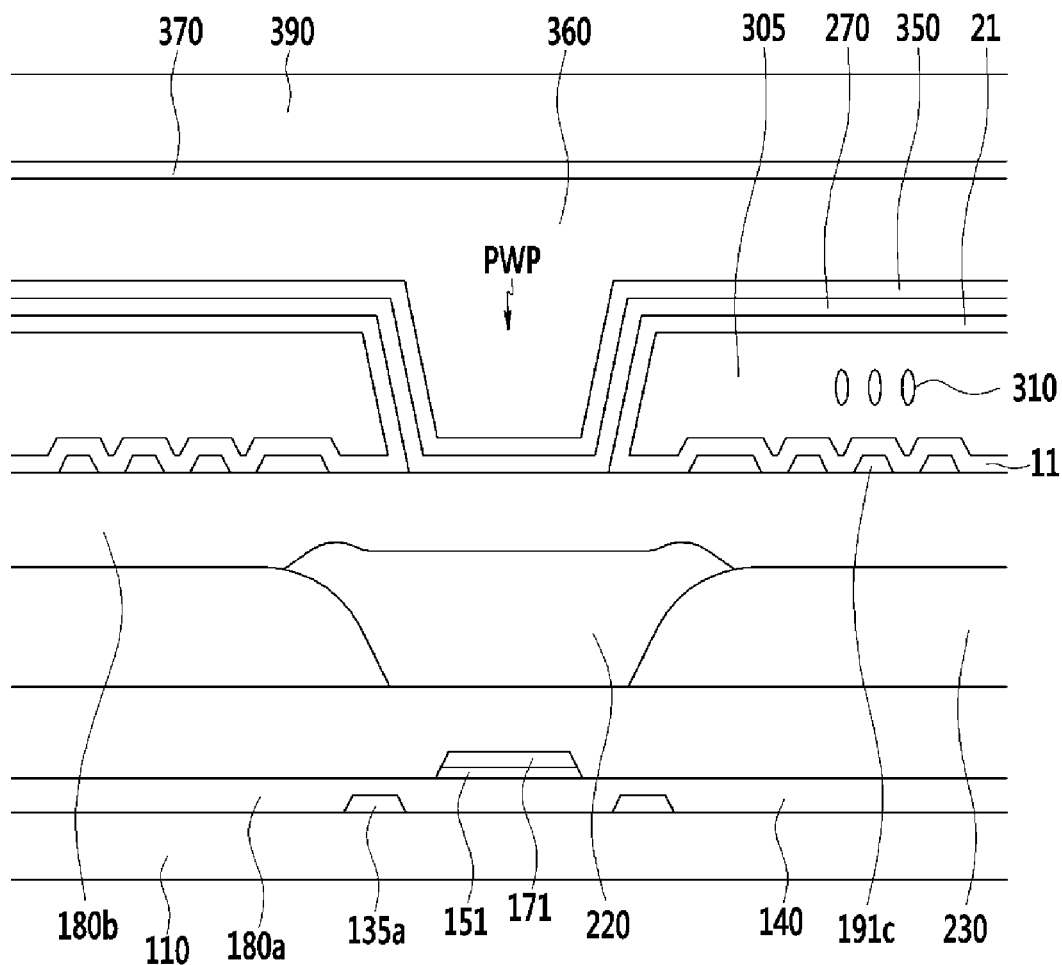
FIG. 9 is a cross-sectional view of the display device of FIG. 7 taken along sectional line IX-IX, according to exemplary embodiments.

The device for monitoring the liquid crystal display and the liquid crystal display formed by the manufacturing method will be described in association with FIGS. 7-9.

FIG. 7 is a plan view of a liquid crystal display, according to exemplary embodiments. FIG. 8 is a cross-sectional view of the liquid crystal display of FIG. 7 taken along sectional line VIII-VIII, whereas FIG. 9 is a cross-sectional view of the liquid crystal display of FIG. 7 taken along sectional line IX-IX.

With continued reference to FIGS. 1-3, a gate line 121 and a storage electrode line 131 are formed on an insulation substrate 110 made of any suitable material, such as, for example, transparent glass, plastic, and/or the like. The gate line 121 includes a gate electrode 124. The storage electrode line 131 mainly extends in the second (e.g., horizontal) direction and is configured to transfer a predetermined voltage, such as a common voltage (Vcom). The storage electrode line 131 includes a pair of vertical portions 135a that extend substantially vertical to the gate line 121, and a horizontal portion 135b connecting ends of the pair of vertical portions 135a to each other. The storage electrodes 135a and 135b have a structure surrounding a pixel electrode 191.

A gate insulating layer 140 is formed on the gate line 121 and the storage electrode line 131. A semiconductor layer 151 positioned on a lower portion of a data line 171, and a semiconductor layer 154 positioned on lower portions of source/drain electrodes 173 and 175 and a channel portion of a thin film transistor Q are formed on the gate insulating layer 140.

A plurality of ohmic contacts (not shown) may be formed on each semiconductor layer 151 and 154, and between the data line 171 and the source/drain electrodes 173 and 175.

Data conductors 171, 173, and 175 including the source electrode 173, the data line 171 connected to the source electrode 173, and the drain electrode 175 are formed on each of the semiconductor layers 151 and 154 and the gate insulating layer 140.

The gate electrode 124, the source electrode 173, and the drain electrode 175 form a thin film transistor Q together with the semiconductor layer 154, and a channel of the thin film transistor Q is formed at the semiconductor layer portion 154 between the source electrode 173 and the drain electrode 175.

A first interlayer insulating layer 180a is formed on the data conductors 171, 173, and 175 and the exposed portion of the semiconductor layer 154. The first interlayer insulating layer 180a may include any suitable inorganic insulator, such as, for example, silicon nitride (SiNx), silicon oxide (SiOx), etc., and/or any suitable organic insulator.

A color filter 230 and a light blocking member (black matrix) 220 are formed on the first interlayer insulating layer 180a.

The light blocking member 220 has a lattice structure including an opening corresponding to a region for displaying an image, and is formed of any suitable material through which light does not penetrate. The color filter 230 is formed in the opening of the light blocking member 220. In exemplary embodiments, the light blocking member 220 is open over the thin film transistor Q in order to enable the thin film transistor Q to be repaired or otherwise modified during one or more subsequent manufacturing processes. In other words, the opening of the light blocking member 220 may be formed to include a region over which the thin film transistor Q is formed.

The color filter 230 may facilitate the display of any suitable color, such as one of the primary color, e.g., red, green, and blue colors. It is contemplated, however, that the color filter 230 may facilitate the display of other colors, such as, for instance, cyan, magenta, yellow, white-based colors, etc. The color filter 230 may be formed of any suitable material(s) configured to enable displaying different colors for each of the adjacent pixels.

A second interlayer insulating layer 180b is formed on the color filter 230 and the light blocking member 220 to cover the color filter 230 and the light blocking member 220. The second interlayer insulating layer 180b may include any suitable inorganic insulator, such as, for instance, silicon nitride (SiNx), silicon oxide (SiOx), etc., and/or any suitable organic insulator. Unlike as shown in FIG. 2, when a step occurs due to a difference in thicknesses of the color filter 230 and the light blocking member 220, the second interlayer insulating layer 180b may be provided to reduce or remove the step.

A contact hole 185, through which the drain electrode 175 is exposed, is formed in the color filter 230, the light blocking member 220, and the interlayer insulating layers 180a and 180b.

The pixel electrode 191 is formed on the second interlayer insulating layer 180b. The pixel electrode 191 may be made of any suitable transparent conductive material, such as, for instance, aluminum zinc oxide (AZO), gallium zinc oxide (GZO), indium tin oxide (ITO), indium zinc oxide (IZO), indium tin zinc oxide (ITZO), etc. It is also contemplated that one or more conductive polymers (ICP) may be utilized, such as, for example, polyaniline, poly(3,4-ethylenedioxythiophene)poly(styrenesulfonate) (PEDOT:PSS), etc.

The "overall" shape of the pixel electrode 191 may form a quadrilateral configuration; however, any other suitable configuration may be utilized. As shown, the pixel electrode 191 includes a cross-shaped stem portion formed of a horizontal stem portion 191a and a vertical stem portion 191b crossing the horizontal stem portion 191a. Further, the pixel electrode 191 may be divided into a plurality of sub-regions (e.g., four sub-regions) by the horizontal stem portion 191a and the vertical stem portion 191b. Each sub-region may include a plurality of fine branch portions 191c. Further, in exemplary embodiments, an outskirt stem portion surrounding an outskirt of the pixel electrode 191 may be included.

The fine branch portion 191c of the pixel electrode 191 forms an angle of about 40° to 45° with the gate line 121 or the horizontal stem portion 191a. Further, the fine branch portions 191c of two adjacent sub-regions may be orthogonal (or substantially orthogonal) to each other. Further, a width of the fine branch portion 191c may be gradually increased, and intervals between the fine branch portions 191c may be the same or different from each other.

The pixel electrode 191 is physically and electrically connected to the drain electrode 175 through the contact hole 185, and receives a data voltage from the drain electrode 175.

The aforementioned descriptions of the thin film transistor Q and the pixel electrode 191 are merely exemplary, and a thin film transistor structure (or switching element) and a pixel electrode design may be modified to, for example, improve lateral surface visibility, etc.

A first (e.g., lower) alignment layer 11 is formed on the pixel electrode 191, and the lower alignment layer 11 may be a vertical alignment layer. The lower alignment layer 11 may be formed including any suitable material generally used as a liquid crystal alignment layer, such as polyamic acid, polysiloxane, polyimide, etc.

A second (e.g., upper) alignment layer 21 is positioned on a portion facing the lower alignment layer 11. A microcavity 305 is formed between the lower alignment layer 11 and the upper alignment layer 21. Liquid crystal material including liquid crystal molecules 310 is injected into the microcavity 305, and the microcavity 305 has a liquid crystal injection hole 307. The microcavity 305 may be formed in a column direction of the pixel electrode 191, or, in other words, a vertical direction. In exemplary embodiments, the alignment material forming the alignment layers 11 and 21 and the liquid crystal material including the liquid crystal molecule 310 may be injected into the microcavity 305 using a capillary force.

According to exemplary embodiments, the microcavity 305 may be formed based on the aforementioned device for monitoring the liquid crystal display. For example, in FIG. 3, since the microcavity is formed by removing the first sacrificial layer 300a and defects may be caused if the first sacrificial layer 300a is not completely removed, the etchant (e.g., liquid chemical) for removing the first sacrificial layer 300a may be replaced according to the aforementioned device for monitoring the liquid crystal display and method for manufacturing the liquid crystal display. This may be done to prevent or otherwise reduce the occurrence of defects.

The microcavity 305 is divided in a vertical direction by a plurality of liquid crystal injection hole forming regions 307FP positioned at an overlapping portion with the gate line 121, and is formed in plural in an extension direction of the gate line 121. Each of the microcavities 305 formed in plural may correspond to the pixel region, and the pixel region may correspond to a region utilized to display an image. In exemplary embodiments, since the liquid crystal material is injected through the liquid crystal injection hole 307 of the microcavity 305, the liquid crystal display may be formed without forming a separate upper substrate.

A common electrode 270 and a lower insulating layer 350 are positioned on the upper alignment layer 21. The common electrode 270 receives a common voltage and forms an electric field together with the pixel electrode 191 to which a data voltage is applied. The imposition of the electric field may be utilized to control an inclination direction of the liquid crystal molecules 310 positioned in the microcavity 305 between the two electrodes 191 and 270. The common electrode 270 and the pixel electrode 191 form a capacitor, which is configured to maintain the applied voltage for a duration of time after the thin film transistor is "turned off." The lower insulating layer 350 may be formed of any suitable material, such as, for example, silicon nitride (SiNx), silicon oxide (SiOx), etc.

According to exemplary embodiments, the common electrode 270 may be disposed on the microcavity 305 (as shown in the drawings) or may be formed on a lower portion of the microcavity 305 to drive the liquid crystal disposed in the microcavity 305 based on a coplanar electrode (CE) mode.

A roof layer 360 is positioned on the lower insulating layer 350. The roof layer 360 serves to support the microcavity 305 defining a space between the pixel electrode 191 and the common electrode 270. The roof layer 360 may include any suitable material, such as, for example, silicon oxycarbide (SiOC), a photoresist, and/or other organic materials. When the roof layer 360 includes silicon oxycarbide (SiOC), the roof layer 360 may be formed via a chemical vapor deposition method. When the roof layer 360 includes the photoresist, the roof layer 360 may be formed by a coating method. It is contemplated, however, that any other suitable process may be utilized. It is noted that silicon oxycarbide (SiOC) enables high transmittance and strain does not occur because layer stresses are small among the layers formed by, for example, the chemical vapor deposition method. Accordingly, when the roof layer 360 is formed of silicon oxycarbide (SiOC), a stable layer through which light passes well may be formed.

An upper insulating layer 370 is positioned on the roof layer 360. The upper insulating layer 370 may come into contact with an upper surface of the roof layer 360. The upper insulating layer 370 may be formed of any suitable material, such as, for example, silicon nitride (SiNx), silicon oxide (SiOx), etc. A capping layer 390 is positioned on the upper insulating layer 370. The capping layer 390 comes into contact with an upper surface and a lateral surface of the upper insulating layer 370. The capping layer 390 covers the liquid crystal injection hole 307 of the microcavity 305 exposed by the liquid crystal injection hole forming region 307FP. The capping layer 390 may be formed of, for example, a thermosetting resin, silicon oxycarbide (SiOC), graphene, etc.

When the capping layer 390 is formed of graphene, since graphene typically exhibits high permeation resistance to gas including helium, and the like, the capping layer 390 may be configured to cover the liquid crystal injection hole 307. Further, since graphene is a material having a carbon bond, even though graphene comes into contact with the liquid crystal material, the liquid crystal material may not be contaminated. Moreover, graphene may serve to protect the liquid crystal material with respect to external contaminants, such as oxygen, moisture, debris, etc.

An overcoat layer (not illustrated) formed of an inorganic layer or an organic layer may be positioned on the capping layer 390. The overcoat layer may serve to protect the liquid crystal molecules 310 injected into the microcavity 305 from an external impact, as well as planarize the layer capping layer 390.

According to exemplary embodiments, the liquid crystal injection hole forming region 307FP is formed between the microcavities 305 adjacent in a vertical direction. A light blocking layer 500 covering the thin film transistor Q and the contact hole 185 is formed in the liquid crystal injection hole forming region 307FP. The light blocking layer 500 is formed of any suitable material capable of reducing a leakage current of the thin film transistor Q due to external light and blocking light in order to prevent a reduction in a contrast ratio due to reflected light. The light blocking layer 500 may be made of any suitable organic material. The light blocking layer 500 may be formed of the same material as the light blocking member 220. In exemplary embodiments, the light blocking layer 500 may be formed in a longitudinal extension direction of the gate line 121.

A first passivation layer 340 is positioned on a lower portion of the light blocking layer 500. A common electrode portion 270a and a second passivation layer 350a are positioned on the light blocking layer 500. In this manner, the first passivation layer 340 and the second passivation layer 350a may be formed to surround the light blocking layer 500 and configured to prevent the light blocking layer 500 from being exposed to the outside. A passivation layer including the first passivation layer 340 and the second passivation layer 350a may be formed of any suitable material, such as, for example, silicon nitride (SiNx), silicon oxide (SiOx), etc.

According to exemplary embodiments, the first passivation layer 340 may be formed in only the liquid crystal injection hole forming region 307FP, and the second passivation layer 350a may be formed at the same level as the lower insulating layer 350.

The capping layer 390 may cover the light blocking layer 500, as well as the liquid crystal injection hole 307. To this end, the capping layer 390 may fill the liquid crystal injection hole forming region 307FP between the microcavity 305 and the light blocking layer 500.

According to exemplary embodiments, as illustrated in FIG. 3, a partition forming portion PWP is formed between the microcavities 305 adjacent in a horizontal direction. The partition forming portion PWP may be formed in a longitudinal extension direction of the data line 171, and may be formed together with the light blocking layer 500, such as simultaneously formed with the light blocking layer 500. Accordingly, the partition forming portion PWP may be made of the same material as the light blocking layer 500.

A polarizer (not illustrated) may be positioned on a lower portion of the insulation substrate 110 and an upper portion of the upper insulating layer 370. The polarizer may include a polarization element generating polarization and a TAC (tri-acetyl-cellulose) layer for ensuring durability. Directions of transmissive axes of an upper polarizer and a lower polarizer may be vertical or parallel according to exemplary embodiments.

While certain exemplary embodiments and implementations have been described herein, other embodiments and modifications will be apparent from this description. Accordingly, the invention is not limited to such embodiments, but rather to the broader scope of the presented claims and various obvious modifications and equivalent arrangements.

What is claimed is:

1. A method for manufacturing a liquid crystal display, comprising:
    applying a sacrificial layer forming material on a substrate comprising a display region and a non-display region;
    patterning the sacrificial layer forming material using a mask to form a first sacrificial layer in the display region and a second sacrificial layer in the non-display region;
    forming a roof layer to cover the first sacrificial layer and the second sacrificial layer; and
    simultaneously etching the covered first and second sacrificial layers to form tunnel-shaped cavities in the roof layer,
    wherein:
        the first sacrificial layer has a first longitudinal dimension and a first cross-sectional area;
        the second sacrificial layer has a second longitudinal dimension and a second cross-sectional area;
        the first cross-sectional area and the second cross-sectional area are the same as one another; and
        the second longitudinal dimension is longer than the first longitudinal dimension.

2. The method for manufacturing a liquid crystal display of claim 1, further comprising:
    monitoring the degree of etching of the second sacrificial layer to determine the extent of removal of the first sacrificial layer.

3. The method for manufacturing a liquid crystal display of claim 2, wherein:
    the first sacrificial layer is configured to be completely removed over a first processing time;
    the first sacrificial layer and the second sacrificial layer are to be simultaneously etched over a second processing time; and
    the second processing time is at least 150% greater than the first processing time.

4. The method for manufacturing a liquid crystal display of claim 3, wherein the second sacrificial layer comprises:
    a first section where the degree of etching of the second sacrificial layer ranges from 100% of the first longitudinal dimension to a first upper limit percentage value of the first longitudinal dimension; and
    a second section where the degree of etching the second sacrificial layer ranges from the first upper limit percentage value to a second upper limit percentage value of the first longitudinal dimension,
    wherein the first upper limit percentage value is greater than 100%, and
    wherein the second upper limit percentage value is greater than the first upper limit percentage value.

5. The method for manufacturing a liquid crystal display of claim 4, wherein the second sacrificial layer further comprises:
    a third section where the degree of etching of the second sacrificial layer is 100% or less of the first longitudinal dimension.

6. The method for manufacturing a liquid crystal display of claim 5, further comprising:
    determining that the degree of etching at least extends to the first or third sections; and
    replacing, in response to determining that the degree of etching at least extends to the first or third sections, an initial sacrificial layer removal composition utilized to simultaneously etch the first and second sacrificial layers.

7. The method for manufacturing a liquid crystal display of claim 1, further comprising:
    forming a dummy sacrificial layer disposed adjacent to the second sacrificial layer,
    wherein the dummy sacrificial layer has the same cross-sectional area as the second sacrificial layer.

8. The method for manufacturing a liquid crystal display of claim 1, further comprising:
    removing the etched second sacrificial layer from the non-display region.

9. The method for manufacturing a liquid crystal display of claim 1, further comprising:
    forming, in the display region, a thin film transistor on the substrate; and
    forming a pixel electrode connected to the thin film transistor.

10. The method for manufacturing a liquid crystal display of claim 1, wherein:
    the first longitudinal dimension and the second longitudinal dimension extend in an etching direction of the first sacrificial layer and the second sacrificial layer.

* * * * *